VARIABLE GAIN AMPLIFIER

Filed Oct. 23, 1968 2 Sheets-Sheet 1

Inventor:
HANS RICHARD SCHULZ
By: Michael S. Striker
Attorney

Inventor:
HANS RICHARD SCHULZ

By: Michael S. Striker
Attorney 3,529,258

VARIABLE GAIN AMPLIFIER

Hansrichard Schulz, Villingen, Black Forest, Germany, assignor to Saba Schwarzwalder, Apparate-Bau-Anstalt August Schwer Söhne G.m.b.H., Villingen, Black Forest, Germany Filed Oct. 23, 1968, Ser. No. 769,869
Claims priority, application Germany, Aug. 12, 1968, 1,762,228
Int. Cl. H03g 3/20
U.S. Cl. 330—85 6 Claims

ABSTRACT OF THE DISCLOSURE

The feedback path of an AC amplifier is inductively coupled to the output of the amplifier. It comprises a first full wave rectifier for generating the second harmonic of signal frequency and an amplifier tuned to the second harmonic. It further comprises a second full wave rectifier for generating the fourth harmonic of the signal frequency inductively coupled to the amplifier in the feedback circuit. The output of the second full wave rectifier is filtered and applied to the input stage of the amplifier for varying the gain of said amplifier. It is further applied to the input of the amplifier in the feedback path also for varying the gain of the amplifier.

CROSS REFERENCE TO RELATED APPLICATION

This application relates to application Ser. No. 769,867, filed Oct. 23, 1968 and entitled, "Measuring Short Distances" filed simultaneously by the same inventor.

BACKGROUND OF THE INVENTION

Variable gain amplifiers are well known in the electronic field, and in particular in connection with radio and television circuits. In these amplifiers the regulation of the gain may take place in a feedback path, or alternatively in the forward path of the amplifier. For example, dynamic regulation may be required, if the input signals which are to be amplified vary greatly in amplitude, that is have a range including both very small and very large amplitudes. This is for example the case in the transmission of music by an orchestra, since great amplitude variations result due to the difference in loudness between pianissimo and fortissimo. If no regulation were supplied, the signals of higher amplitude would overdrive the output stages. This overdriving may be avoided by varying the gain of the amplifier in dependence on the amplitude of the signal. This may be achieved by deriving a direct current voltage from the signal and applying this to the amplifier in such a way that the operating point of the amplifier is changed, thus changing its gain. If the direct current voltage is applied to a previous stage, a feedback regulation exists, while application of the direct current voltage to a subsequent stage is known as forward regulation.

Regulation of this type may also be required in amplifiers used in measuring instruments wherein the input signals have an amplitude which varies over a wide range. This is the case for example when distances are measured by means of capacitive or inductive sensors.

In order to avoid alternating current feedback in regulating arrangements described above, it is necessary to have substantially complete filtering to suppress the alternating current components which are superimposed upon the direct current signals. On the other hand, a high degree of filtering results in a large time constant, which is often too large for particular applications in the measuring of controlled fields.

SUMMARY OF THE INVENTION

It is the object of this invention to furnish a variable gain alternating current amplifier wherein the gain control is accomplished without signal feedback and in a stable manner, while maintaining a small time constant.

This invention comprises a variable gain amplifier for amplifying an input signal having a signal frequency. It comprises forward amplification means for generating an amplified signal in response to said input signal, the ratio of amplified signal to input signal constituting the gain of said variable gain amplifier. It further comprises frequency converter means coupled to said forward amplification means, for generating a multiple frequency signal having an amplitude which varies with changes in amplitude of said amplified signal, but having a higher frequency. It further comprises means for generating a direct current signal from said multiple frequency signal and means for applying said direct current signal to the input of said variable gain amplifier in such a manner that the gain of said amplifier changes with variation thereof.

In the above arrangement the low time constant results from the fact that the filtering factor increases with increasing frequency. Therefore, for the higher frequencies filtering components resulting in a lower time constant may be used. Furthermore, the effectiveness of the filtering is not as important as previously, since the alternating current components superimposed upon the resultant direct current signal are no longer of the same frequency as the input signal frequency.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
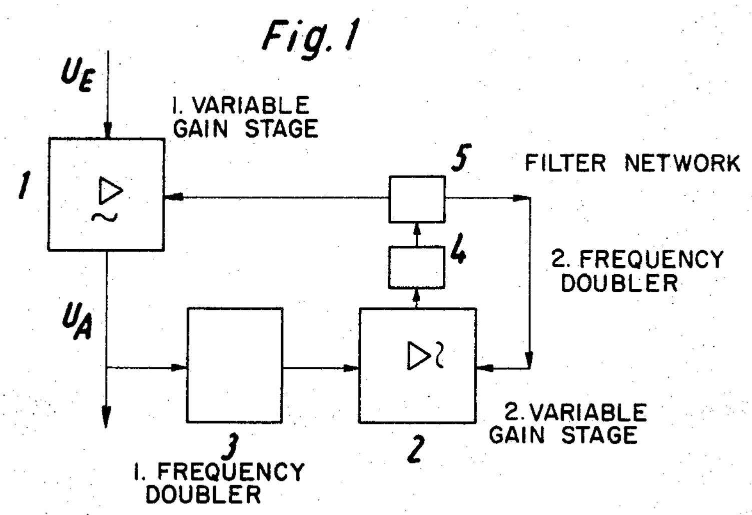
FIG. 1 is the block diagram of a variable gain amplifier in accordance with this invention.

The preferred embodiment illustrated in the drawing will now be discussed. In the block diagram in FIG. 1, which shows the variable gain amplifier in accordance with this invention, reference numeral 1 denotes the forward amplification means, here an alternating current amplifier. The output of the alternating current amplifier is denoted by $U_A$, while its input is denoted by $U_E$. Frequency converter means here embodied in full wave rectifier means 3 are connected to the output of the alternating current amplifier. The output of the frequency converter means is in turn connected to second amplifier means denoted by reference numeral 2, whose output is connected to additional full wave rectifier means denoted by reference numeral 4. The output of the additional full wave rectifier means 4 is connected to filter means 5, whose output in turn is connected to the forward amplification means 1 in such a manner as to vary the gain of said forward amplification means. The output of the filter means may also be connected to the second amplifier means for varying the gain of said second amplifier means. The filter means 5 here constitute means for generating a direct current signal from the multiple frequency signal.

Figure 2:
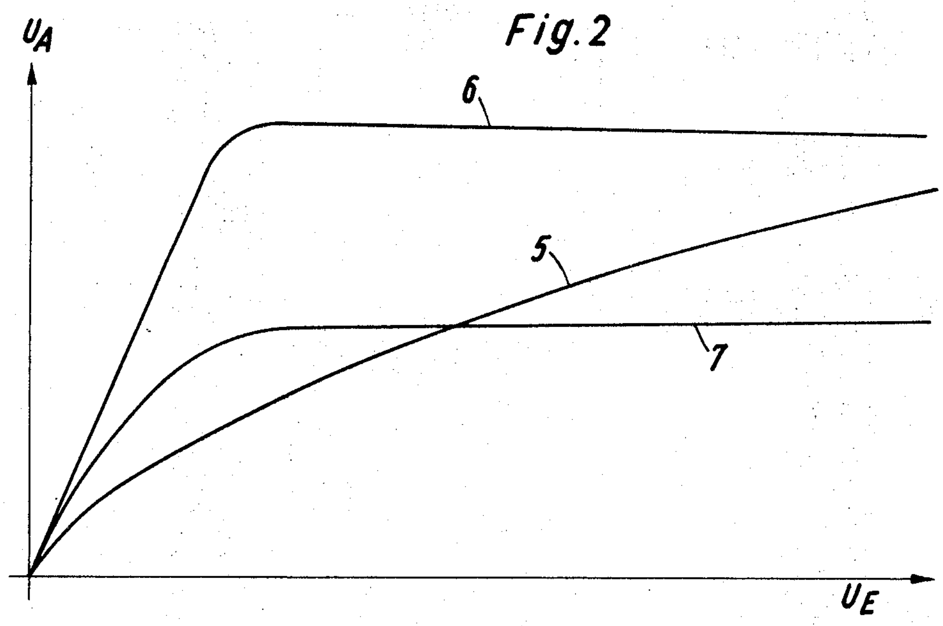
FIG. 2 is a diagram showing the output voltage $U_A$ as a function of the input voltage $U_E$ of a variable gain amplifier in accordance with the present invention, and comparative curves for conventional amplifiers.

The arrangement shown in FIG. 1 may be used to generate a wide variety of input-output characteristics ($U_A$ vs. $U_E$), by suitably adjusting the amount of direct current signal fed back to alternating current amplifier 1 and second amplifier means 2. One of these characteristics is shown in curve 5 of FIG. 2. Also shown in FIG. 2 are comparative curves for unregulated amplifier whose characteristics are indicated by curve 6 and the same amplifier with the conventional feedback arrangement, having an input-output characteristics shown by curve 7 of FIG. 2. It will be seen that the amplifier in accordance with this invention has a much greater linear region than either of the conventional amplifiers. It will be seen by reference to FIG. 2, that both curves 6 and 7 result in almost no change in output signal for increasing input signal over a wide region wherein there is still a linear variation of output signal with input signal for the amplifier regulated in accordance with the present invention.

If no feedback is applied to the second amplifier means, but only feedback to the alternating current amplifier 1 is used in a system according to this invention, then a characteristic curve approximately corresponding to line 7 will result. However the time contant of such an amplifier in accordance with this invention is substantially smaller than the corresponding time constant for conventionally feedback regulated amplifiers.

Figure 3:
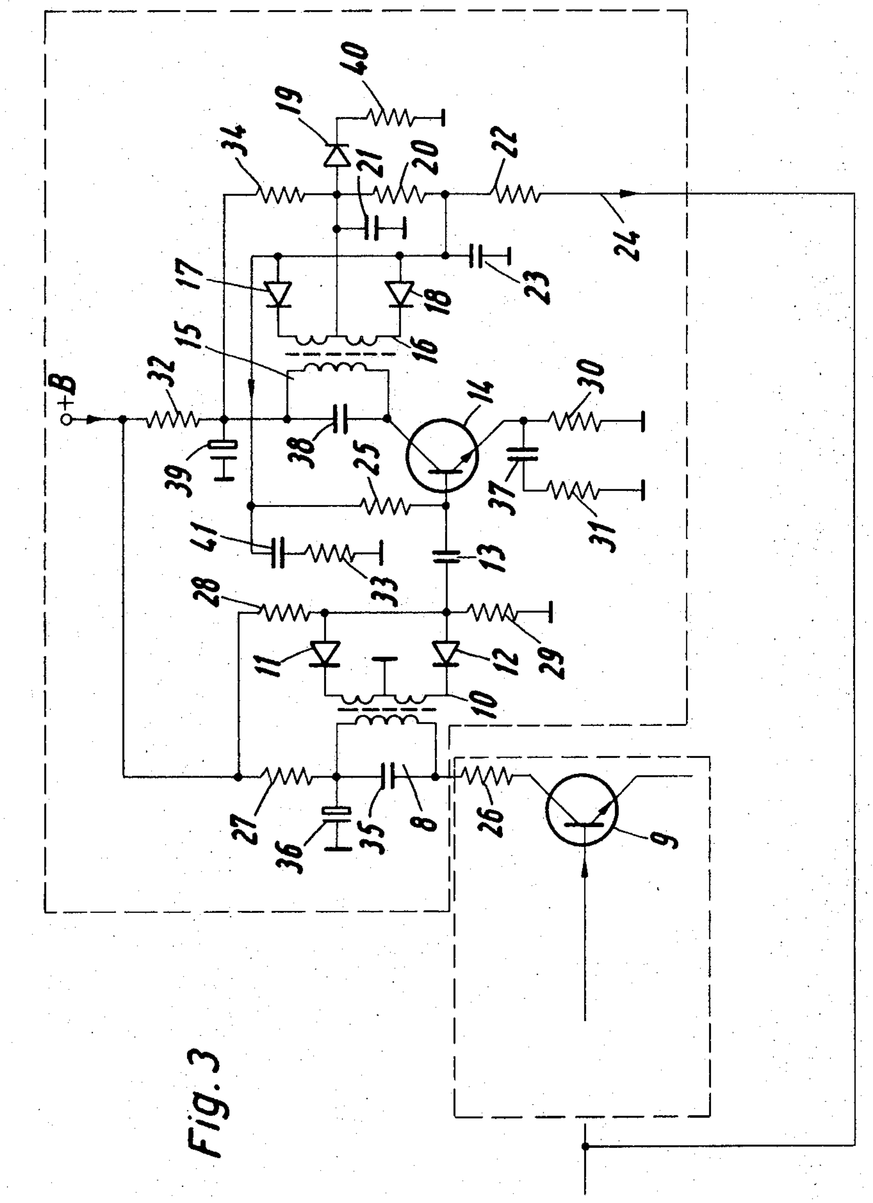
FIG. 3 is a circuit diagram of a preferred embodiment of the feedback of a variable gain amplifier in accordance with this invention.

A preferred embodiment of the present invention is shown in circuit diagram form in FIG. 3. Only the last stage consisting of transistor 9 of the alternating current amplifier is shown. The frequency converter means are coupled to the output stage comprising transistor 9 of the alternating current amplifier by means of a bifilar winding of a transformer. The bifilar winding is denoted by reference numeral 10. This winding feeds the diodes 11 and 12 which are connected in a full wave rectifier circuit and constitute full wave rectifier means. The output of the full wave rectifier means is connected by means of a capacitor 13 to the base of transistor 14 which serves as second amplifier means. The full wave rectifier circuit generates the second harmonic of the base frequency, to which the oscillating circuit 15 in the collector circuit of transistor 14 is tuned. To this oscillator circuit tuned to the second harmonic is coupled the additional rectifier means comprising diodes 17 and 18 by means of a second bifilar winding 16. The additional full wave rectifier means comprised by diodes 17 and 18 thus serve to generate the fourth harmonic. The resultant signal is filtered by means of filtering means comprising the RC filters 22 and 23. The center tap of the second bifilar winding 16 is connected to a voltage divider 32, 34, 19, 40 generating a positive bias voltage filtered by capacitor 21. The diode 19 effects temperature compensation and voltage stabilization of the controlled amplifier stages 14 as well the variable gain amplifier as the first stage of the alternating current amplifier. The output 24 of this filtering means is connected to the first stage of the alternating current amplifier.

As shown in the figure, the second amplifier means comprising transistor 14 also has a feedback path. This feedback path comprises the resistor 25 which is connected from the anodes of diodes 17 and 18 to the base of transistor 14. Thus the gain of the second amplifier means will also vary in accordance with the amplified signal, or the signal denoted by $U_A$ in FIG. 1. If a supply voltage of 12 volts is assumed and a base frequency of 8 kHz., then in order to achieve the linear characteristic denoted by curve 5 in FIG. 2 the embodiment of FIG. 3 should comprise components in accordance with the following values:

| | |
|---|---|
| **R20**=100KΩ | **C13**=270 pf. |
| **R22**=10KΩ | **C21**=0.1 μf. |
| **R25**=27KΩ | **C23**=0.1 μf. |
| **R26**=330Ω | **C35**=47 nf. |
| **R27**=220Ω | **C36**=50 μf. |
| **R28**=470KΩ | **C37**=1 μf. |
| **R29**=10KΩ | **C38**=10 nf. |
| **R30**=680Ω | **C39**=25 μf. |
| **R31**=1.2KΩ | **C41**=1 μf. |
| **R32**=1KΩ | |
| **R33**=6.8KΩ | |
| **R34**=22KΩ | |
| **R40**=2.5KΩ | |

The inductivity of the oscillating circuit is 11 mH.

If, as mentioned above, a base frequency of 2 kHz. is assumed, then the first full wave amplifier means comprising diodes 11 and 12 effect a frequency conversion to 16 kHz., while the additional full wave rectifier means comprising diodes 17 and 18 effect a frequency conversion to 32 kHz. This results in a very stable regulation having a very small time constant and no back coupling effects.

Use of a variable gain amplifier in accordance with this invention is not limited to occasions where a linear characteristic is required. An entirely different application, where the amplifier is used to compensate for a highly non-linear input signal, that is to generate a linear output signal in response to such a non-linear input signal is shown in the cross-reference application, where the amplifier is used as a component in a distance measuring device.

While the invention has been illustrated and described as embodied in an amplifier having a linear input-output characteristic, it is not intended to be limited to the details shown, since various modification and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalents of the following claims.

What is claimed as new and desired to be protected by Letters Patent is set forth in the appended claims.

I claim:

1. A variable gain amplifier for amplifying an input signal having a signal frequency, comprising, in combination, an amplifier input for receiving said input signal; forward amplification means connected to said amplifier input for generating an amplified signal at an amplifier output in response to said input signal; and a feedback path connecting said amplifier output to said amplifier input, said feedback path comprising frequency converter means coupled to said forward amplification means, for generating a multiple frequency signal having an amplitude which varies with changes in amplitude of said amplified signal, but having a higher frequency, said feedback path further comprising second amplifier means connected to said frequency converter means, said second amplifier means having a second amplifier input, a second amplifier output, and second amplifier feedback means connecting said second amplifier output to said second amplifier input in such a manner that the gain of said second amplifier means varies in dependence upon the signal at said second amplifier output.

2. A variable gain amplifier as set forth in claim 1, wherein said second amplifier feedback means comprise additional frequency converter means.

3. A variable gain amplifier as set forth in claim 2, wherein said second amplifier feedback means further comprise filter means connected to said additional frequency converter means; and wherein the output of said filter means is connected to the input of said forward amplification means and to said second amplifier input means in such a manner that the gain of said forward amplification means and of said second amplifier means varies in dependence thereon.

4. A variable gain amplifier as set forth in claim 1, wherein the frequency of said multiple frequency signal is twice the frequency of said input signal.

5. A variable gain amplifier as set forth in claim 2, wherein the frequency of said multiple frequency signal is twice the frequency of said input signal; and wherein said additional frequency converter means comprise frequency doubler means.

6. A variable gain amplifier as set forth in claim 1, wherein said amplified signal varies linearly with said input signal.

References Cited

UNITED STATES PATENTS

| | | | |
|---|---|---|---|
| 2,611,081 | 9/1952 | Spencer | 330—132 X |
| 2,803,711 | 8/1957 | Wiggin et al. | 330—140 |

ROY LAKE, Primary Examiner

J. B. MULLINS, Assistant Examiner

U.S. Cl. X.R.

330—29, 140